United States Patent [19]
Parikh et al.

[11] Patent Number: 5,334,283
[45] Date of Patent: Aug. 2, 1994

[54] PROCESS FOR SELECTIVELY ETCHING DIAMOND

[75] Inventors: Nalin R. Parikh, Chapel Hill; John D. Hunn, Pittsboro, both of N.C.

[73] Assignee: The University of North Carolina at Chapel Hill, Chapel Hill, N.C.

[21] Appl. No.: 937,401

[22] Filed: Aug. 31, 1992

[51] Int. Cl.$^5$ ............................................. H01L 21/312
[52] U.S. Cl. ..................................... 156/654; 156/643; 437/24; 437/25; 437/26; 437/226; 437/944; 437/974
[58] Field of Search ................... 156/654, 643; 437/24, 437/25, 26, 226, 944, 974

[56] References Cited
U.S. PATENT DOCUMENTS

| | | |
|---|---|---|
| 4,191,734 | 3/1980 | Nelson et al. . |
| 4,277,293 | 7/1981 | Nelson et al. . |
| 4,339,304 | 7/1982 | Grigoriev et al. ................. 156/654 |
| 4,434,188 | 2/1984 | Kamo et al. . |
| 4,450,041 | 5/1984 | Aklufi ................................. 156/628 |
| 4,845,533 | 7/1989 | Pryor et al. . |
| 4,846,931 | 7/1989 | Gmitter et al. . |
| 4,863,529 | 9/1989 | Imai et al. . |
| 4,883,561 | 11/1989 | Gmitter et al. . |
| 4,902,647 | 2/1990 | Chutjian et al. . |
| 4,920,078 | 4/1990 | Bagley . |
| 4,948,629 | 8/1990 | Hacker . |
| 4,952,446 | 8/1990 | Lee et al. ........................... 428/220 |
| 4,954,365 | 9/1990 | Neifeld . |
| 4,957,591 | 9/1990 | Sato et al. ......................... 156/654 |
| 4,997,636 | 3/1991 | Prins . |
| 5,006,203 | 4/1991 | Purdes . |
| 5,022,959 | 6/1991 | Itoh et al. ......................... 156/643 |
| 5,122,509 | 6/1992 | Beetz, Jr. et al. . |
| 5,127,983 | 7/1992 | Imai et al. . |
| 5,130,111 | 7/1992 | Pryor . |
| 5,160,405 | 11/1992 | Miyauchi et al. ................. 156/643 |

FOREIGN PATENT DOCUMENTS

| | | |
|---|---|---|
| 0419087 | 3/1991 | European Pat. Off. . |
| 2244958 | 12/1991 | United Kingdom . |
| 2258760 | 2/1993 | United Kingdom . |

OTHER PUBLICATIONS

Prins, *Preparation of ohmic contacts to semiconducting diamond,* Journal of Physics D: Applied Physics, vol. 22, pp. 1562–1564 (1989).

Joshi et al., *Erosion of diamond films and graphite in oxygen plasma,* Journal of Materials Research, vol. 6, pp. 1484–1490 (1991).

Parikh et al., *Single-crystal diamond plate liftoff achieved by ion implantation and subsequent annealing,* Applied Physics Letter, vol. 61, pp. 3124–3126 (1992).

Kobashi et al., Synthesis Of Diamonds By Use Of Microwave Plasma Chemical-Vapor Deposition: Morphology And Growth Of Diamond Films, Physical Review B; 1988, vol. 38, No. 6, pp. 4067–4084.

Yarborough et al., Current Issues and Problems In the Chemical Vapor Deposition Of Diamond; Science, vol. 247, pp. 688–696.

The Molecule Of The Year; Science 1990 vol. 250, pp. 1637, 1640–1647.

Spear et al., Diamond-Ceramic Coating Of The Future; J. Am. Ceram. Soc. 72, 1989, pp. 171–191.

Yablonovitch et al., Extreme Selectivity In The Lift-Off Of Epitaxial GaAs Films; American Institute of Physics, 1987, pp. 2222–2224.

(List continued on next page.)

*Primary Examiner*—Brian E. Hearn
*Assistant Examiner*—Trung Dang
*Attorney, Agent, or Firm*—Bell Seltzer Park & Gibson

[57] ABSTRACT

A process for selectively etching a diamond substrate comprising the steps of forming a graphitic area within a diamond substrate and selectively etching the diamond substrate with a gaseous reactant under conditions sufficient to convert the graphitic area to a gaseous product, preferably while substantially avoiding reacting with the diamond of the diamond substrate. The technique can be used to form a single crystal diamond layer, for example, using a lift-off technique.

29 Claims, 4 Drawing Sheets

OTHER PUBLICATIONS

Hunn et al., Annealing Of Implantation Damage In Single Crystal Diamond; New Diamond Science and Technology, pp. 929-935.

Braunstein, et al., Radiation Damage And Annealing In Sb Implanted Diamond; Radiation Effects, 1980, vol. 48, pp. 139-144.

Prior et al., Grown Technique For Large Area Mosaic Diamond Films; Mat. Res. Soc. Symp. Proc., pp. 1-9.

Sandhu et al., Regrowth Of Damaged Layers In Diamond Produced By Ion Implantation; vol. 242, 1992, Mat. Res. Soc. Symp. Proc. vol. 162, 1990, pp. 189-194.

Robertson, et al., Epitaxial Growth Of Diamond Films On Si(111) at Room Temperature By Mass-Selected Low Energy C+ Beams; Science, vol. 243, pp. 1047-1050.

PROCESS FOR SELECTIVELY ETCHING DIAMOND

The inventors acknowledge that they were partially supported by funds administered by the Office of Naval Research under Contract No. N00014-92-C-0081. The government may have certain rights to the invention.

FIELD OF THE INVENTION

This invention generally relates to an etching technique for use in making electronic devices such as semiconductor devices, and more particularly to a process of selectively etching diamond.

BACKGROUND OF THE INVENTION

Diamond is a preferred material for semiconductor devices because it has semiconductor properties that are better than traditionally used silicon (Si), germanium (Ge) or gallium arsenide (GaAs). Diamond provides a higher energy band gap, a higher breakdown voltage and a greater saturation velocity than these traditional semiconductor materials. These properties of diamond yield a substantial increase in projected cutoff frequency and maximum operating voltage compared to devices fabricated using Si, Ge, or GaAs. Si is typically not used at temperatures higher than about 200° C. and GaAs is not typically used above 300° C. These temperature limitations are caused, in part, because of the relatively small energy band gaps for Si (1.12 eV at ambient temperature) and GaAs (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase.

Because of the advantages of diamond as a material for semiconductor devices, there is at present an interest in the growth and processes for etching diamond. There has been particular interest in the growth and etching of single crystal diamond thin films. Diamond thin films have been successfully grown by a variety of low pressure and low temperature chemical vapor deposition (CVD) methods, such as filament assisted CVD, plasma CVD, and combustion flames. See Devaries, Ann. Rev. Mater. Sci. 17, 161 (1987); Masumoto et al, J. Mat. Sci. 18, 1823 (1988). In these methods, typically a mixture of hydrocarbons such as $CH_4$ and $C_2H_2$ and hydrogen (98-99.5% by volume) is passed over heated (700°-1000° C.) substrates such as silicon, nickel, copper, tungsten, and silicon carbide. During the process, both diamond and graphite are deposited. However, etching of graphite by hydrogen leaves diamond crystallites which grow further to form polycrystalline films.

Single crystal diamond thin films have been grown epitaxially on diamond substrates, where all three axes of the film are aligned with respect to the underlying substrate (See Geis et al, IEEE-Electron Device Lett. EDL-8, 341 (1987); M. W. Geis, Materials Res. Soc. Pro., 162, 16 (1990)). Homoepitaxial diamond layers can be grown by CVD onto a matrix of oriented diamond microcrystallites embedded in array of etch pits on a silicon substrate (See, Pryor et al., Materials Res. Soc. Pro. 242 (1992)). This method, however, is both costly and time-consuming, and the crystallites are only poorly oriented and have low angle grain boundaries. Moreover, there continues to be a need for thin large area sheets of diamond from bulk or homoepitaxial diamond crystals inasmuch as at present typical crystal diamond substrates have at most an area of several millimeter square.

Another difficulty in processing diamond substrates to be used in fabricating semiconductor devices is the ability to selectively etch the diamond substrate. It is known to etch graphites from diamond by immersion in hot chromic acid. Chromic acid is highly corrosive and toxic thus its large scale use is problematic. Similar to other chemical etchants, chromic acid has a limited useful lifetime and must be prepared fresh for each etch. Secondary acid washes are necessary for removal of chromium deposits from the surface of the sample. Chromic acid provides a relatively slow etch rate of about 0.1 to 0.4 $\mu$m/hr.

SUMMARY OF THE INVENTION

It is therefore an object of the present invention to provide a process for selectively etching a diamond substrate.

It is another object of the present invention to provide a process for selectively etching a diamond substrate, and preferably a single crystal diamond substrate, at a relatively fast etch rate to a predetermined thickness within the diamond substrate.

It is yet another object of the present invention to provide a process for forming thin large area sheets of diamond.

These and other objects are provided according to the present invention by forming one or more graphitic areas within a diamond substrate and selectively etching the substrate with a gaseous reactant (e.g., molecular oxygen). The etching is "selective" in that the etching is conducted under conditions sufficient to convert the graphitic area or areas to a gaseous (volatile) product, preferably while substantially avoiding reacting with the non-graphitized diamond of the substrate. The graphitic area or areas can be formed by implanting the diamond substrate with ions capable of damaging diamond (e.g., carbon and oxygen ions). When diamond is damaged above a critical dose (graphitization dose), it will convert to graphite (i.e., forming a graphitic area) upon annealing at low temperature (e.g., about 500° C.). The ions are implanted to one or more predetermined depths. For example, ion implantation can be done at a single energy (e.g., 4 to 5 MeV) and dose (e.g., $10^{18}$ ions/cm$^2$) to result in a 0.1 to 0.3 $\mu$m thick buried graphitic layer at about 1 to 2 $\mu$m deep. Alternatively, multiple energies and doses can be used to produce overlapping graphitic layers which extend from the surface to about 2 $\mu$m deep.

The selective etching process of the present invention can be used in a process for forming thin large area sheets of single crystal diamond or other diamonds. The process comprises forming a graphitic layer within a single crystal diamond substrate such as by using ion implantation of carbon or oxygen ions. The graphitic layer is at a predetermined depth and divides the single crystal diamond substrate into an upper portion above the graphitic layer and a lower portion beneath the graphitic layer. The single crystal diamond substrate is then selectively etched with the gaseous reactant (e.g., molecular oxygen) under conditions sufficient to convert the graphitic layer to a gaseous product and to form an interface between the upper and lower portions of the single crystal diamond substrate at the predetermined depth. The upper portion is then lifted off the lower portion at the interface to provide a single crystal diamond layer of predetermined thickness substantially equal to the predetermined depth of the interface. In this way, multiple, relatively thin diamond layers can be formed from one relatively thick diamond substrate.

DETAILED DESCRIPTION OF THE PREFERRED EMBODIMENTS

Figure 1:
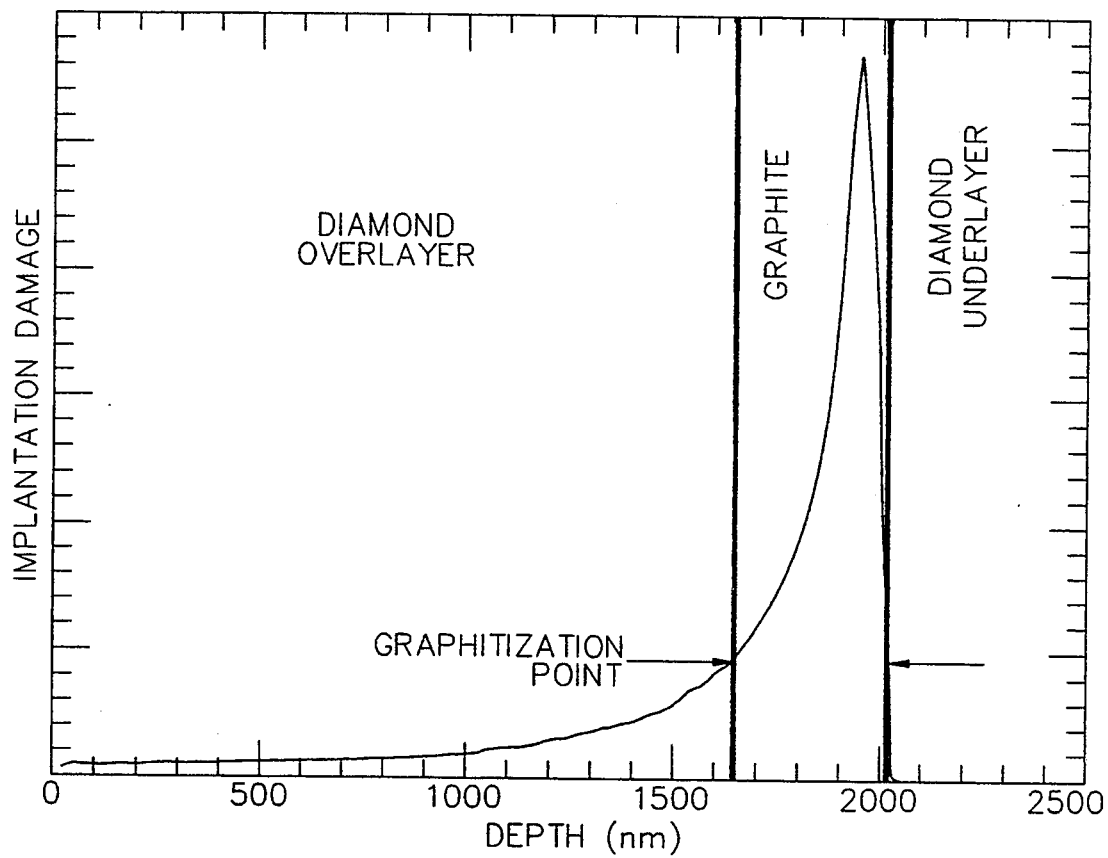
FIG. 1 is a graph showing simulated implantation damage versus depth during ion implantation of a single crystal diamond substrate with $C^+$ ions corresponding to Example 1.

The present invention will now be described more fully hereinafter with reference to the accompanying figures, in which preferred embodiments of the invention are shown. This invention may, however, be embodied in many different forms and should not be construed as limited to the embodiments set forth herein. Rather, applicants provide these embodiments so that this disclosure will be thorough and complete, and will fully convey the scope of the invention to those skilled in the art.

The present invention provides a process for selectively etching a diamond substrate comprising forming a graphitic area within the diamond substrate and selectively etching the substrate with a gaseous reactant (e.g., molecular oxygen) under conditions sufficient to convert the graphitic area to a gaseous (and volatile) product, preferably while substantially avoiding reacting with the diamond of the substrate. The diamond substrate is preferably a single crystal diamond substrate, although the diamond substrate can be homoepitaxial, heteroepitaxial or polycrystalline diamond. Suitable single crystal diamond substrates are natural or synthetic diamond such as the various sized (e.g., $2 \times 2 \times 0.25$ mm, $3 \times 3 \times 0.25$ mm, $4 \times 4 \times 0.25$ mm, etc.) diamond substrates available from Dubbeldee Harris Diamond Corporation, Mount Arlington, N.J.

The graphitic area within the diamond substrate is preferably formed by ion implantation. The ion implantation can be at a single energy to form a graphitic layer having well-defined boundaries confined to a predetermined depth within the diamond substrate by selecting the dose and energy. Alternatively, ion implantation can be at multiple energies to produce graphitic areas which extend from the surface of the diamond substrate to a predetermined depth. Although applicants do not wish to be bound to any particular theory underlying the invention, it is believed that for a single high energy implant (e.g., 4–5 MeV), the initial, near surface, energy loss is mostly in the form of electronic scattering. It is the nuclear scattering, concentrated at the end of the path of the ions, which results in the formation of the graphitic (damage) area. Statistically, this damage is concentrated and confined to a predetermined depth.

The process of ion implantation involves the acceleration of the ion to be implanted and the subsequent bombardment of the ion to introduce the atoms into the surface layer of a diamond substitute, preferably cooled to less than about 80° K. Those skilled in the art will appreciate that various ions and methods of ion implantation are suitable to achieve the appropriate energy dose and levels of the present invention (see Mayer et al, Ion Implantation in Semiconductors, pages 1–3, (1970)). In general, $C^+$ or $O^+$ ions are preferred although heavier ions such as argon, xenon, etc. can be used with a decrease in graphitization dose resulting from the use of heavier ions. The resulting ion implanted substrate is characterized by the depth and concentration of the implanted ions. The depth of the ions is reflected by the implantation energy of the ions in electron volts (eV). The concentration of the ions, or dose, is typically given in ions/cm². Suitable implantation energies range from 60 keV to 300 MeV, preferably 1 to 10 MeV, and most preferably 4 to 5 MeV. Suitable doses range from about $1.0 \times 10^{16}$ to $3.0 \times 10^{18}$ ions/cm², depending upon the energy. The dose and energy determines the predetermined depth and thickness of the graphitic area within the diamond substrate. Additionally, the ion implantation can be patterned using conventional patterning techniques such as masking using gold or other suitable materials to form trenches and the like.

In addition to the implantation of ions into the diamond substrate, controlled doping of the resulting diamond thin film can also be achieved. P-type dopant ions such as boron ($B^+$) and n-type dopant ions such as phosphorous ($P^+$), lithium ($Li^+$) and sodium ($Na^+$) can also be implanted in the substrate using known ion implantation techniques. Suitable ion implantation doses are $1 \times 10^{13}$ to $1 \times 10^{15}$ atoms/cm². Implanting dopant ions in the region of ion implantation accurately controls the doping of the resulting diamond substrate.

After formation of the graphitic area, the diamond substrate can be annealed particularly if carbon ions are used as the implant ions. This annealing produces crystal lattice recovery in the non-graphitized but lightly damaged regions of the diamond substrate. For example, if $C^+$ ions are implanted, the substrate is preferably annealed at ambient pressure in an inert gas (e.g., argon) or in a vacuum of about $10^{-5}$ to $10^{-7}$ Torr for about 30 minutes at about 900° C. to 1000° C.

The implanted (and optionally annealed) diamond substrate is then selectively etched with a gaseous reactant, $A_{(gas)}$. Although applicants do not wish to be bound to any particular theory underlying this invention, it is believed that the following reactions can occur:

$$C_{graphite} + A_{gas} + heat \rightarrow CA_{x\ (gas)} \qquad (I)$$

$$C_{diamond} + A_{gas} + heat \rightarrow CA_{x\ (gas)} \qquad (II)$$

The primary reactants are carbon bonded to a graphite or diamond lattice. Energy to break the carbon-carbon bonds and the gas-gas (e.g., oxygen-oxygen) bond is supplied in the form of heat. Because the carbon bond in the graphite phase is weaker than in the diamond phase, less heat is required to cause Reaction I to occur. Thus the graphitic area is volatized to $CA_{x(gas)}$ and is removed whereas the diamond is uneffected (undamaged) in a certain temperature range.

A particularly suitable gaseous reactant, A is molecular oxygen. Thus, when molecular oxygen is used the graphitic area is oxidized to form a gaseous product, $CO_x$. The etch rate for this process is several orders of magnitude greater than conventional etching techniques such as chromic acid etching techniques. It is noted that if $O^+$ ions are implanted, the introduction of additional molecular oxygen may not be necessary.

The selectively etched diamond substrate can be used in a variety of manners. For example, a single crystal diamond substrate can have grown thereon a semiconducting homoepitaxial diamond thin film such as described in Geis et al, IEEE-Electron Device Lett. EDL-8, 341 (1987); M. W. Geis, Materials Res. Soc. Pro., 162, 16 (1990). Preferably, the diamond thin film is homoepitaxially grown on the diamond substrate after formation of the graphitic area but before selective etching. Conventional techniques for removing the diamond thin film from the diamond substrate, such as cleaving, are difficult to control and often result in damage to the diamond thin film or the diamond substrate or both. The method of the present invention permits a lift-off technique to be used to obviate this problem. Moreover, the diamond substrate which is often expensive can be reused after lift-off.

In one embodiment using a lift-off technique, ion implantation is conducted to form a graphitic layer having well-defined boundaries dividing a diamond substrate, and preferably a single crystal diamond substrate, into an upper portion above the graphitic layer and a lower portion below the graphitic layer. The substrate is then selectively etched with the gaseous reactant, $A_{(gas)}$ under conditions sufficient to convert the graphitic layer to a gaseous product, $CA_{x(gas)}$ and to form an interface between the upper and lower portions while substantially avoiding reacting with the diamond of the upper and lower portions of the diamond substrate. For lift-off, the gasesus reactant is introduced so as to diffuse from the edge of the substrate. The upper portion can then be lifted-off from the lower portion to provide a diamond thin film layer. The etching and the lift-off can occur substantially simultaneous. The lower portion can be reused as a diamond substrate and is capable of having additional thin films grown thereon.

The ability to lift-off thin large single crystal diamond layers or other diamond layers (sheets) from a diamond substrate is one of the first steps in making homoepitaxial diamond films commercially viable. One commercial drawback is the prohibitive cost of the single crystal diamond substrate. The present invention including the lift-off techniques can be used to produce multiple homoepitaxial diamond thin films from one initial substrate. The diamond substrate could be self-renewing and self-propagating giving an unlimited and relatively inexpensive supply of single crystal diamond substrates.

This economy can be further advanced using a technique to form a large area diamond layer using, for example, smaller (and less expensive) in area single crystal diamond substrates. A plurality of small area (e.g., $2 \times 2 \times 0.25$ mm) diamond substrates are placed in contacting relationship with each other with the crystal directions thereof aligned substantially the same to form a template. A thin single crystal diamond layer (film) is homoepitaxially grown over the template. The single crystal diamond layer and template are ion implanted and selectively etched in the manner previously described. If a lift-off technique is used, the predetermined depth is such that the graphitic layer is buried in the grown single crystal diamond layer. After selectively etching with the gaseous reactant $A_{gas}$, the single crystal diamond layer is lifted-off from the template to provide a large area (e.g., $8 \times 8 \times 0.25$ mm) single crystal diamond layer.

The examples which are provided to further illustrate the present invention, and are not to be construed as limiting thereof.

Example 1

Figure 2:
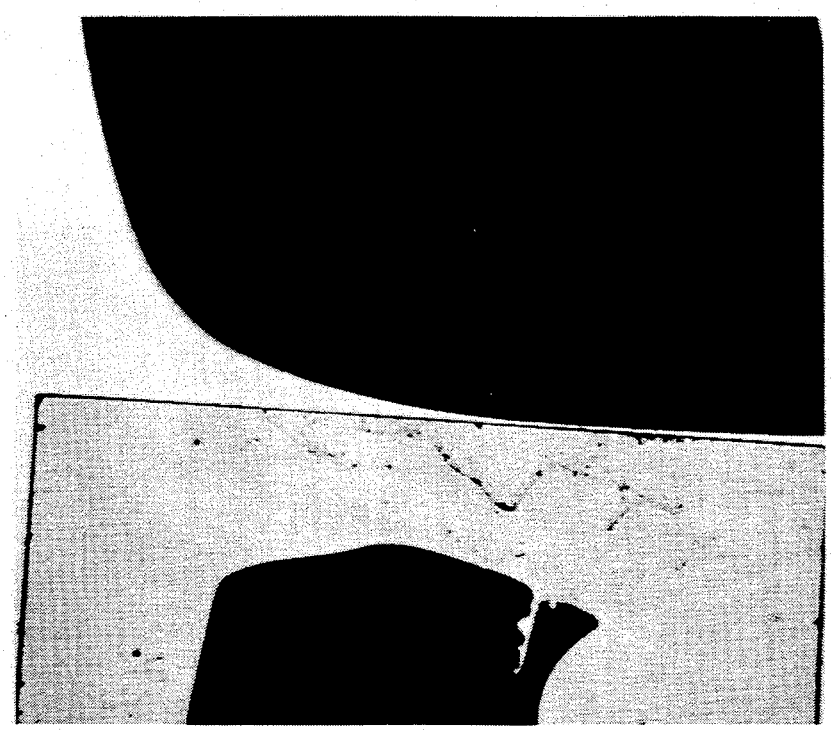
FIG. 2 is an SEM micrograph of a selectively etched single crystal diamond substrate corresponding to Example 1.

A Type Ia single crystal diamond substrate measuring $3 \times 3 \times 0.25$ mm available from Dubbeldee Harris Diamond Corporation of Mount Arlington, N.J. is cooled to 80° K. and implanted with $10^{18}$ $C^+$ions/cm$^2$ at 4 MeV to produce a graphitic layer about 1650 nm to 2000 nm deep. The simulated implantation damage is shown graphically in FIG. 1 and is determined using Monte Carlo computer programs such as software commonly referred to as "TRIM". The sample is annealed and etched in a pure molecular oxygen ambient for 1 hour at 550° C. This resulted in etching the buried layer approximately 120 $\mu$m in from the edge. An additional 4 hours of molecular oxygen annealing and etching resulted in complete lift-off of the surface plate as can be seen in FIG. 2. The thin surface plate has turned brown indicating a low level of crystal damage. The remaining diamond substrate is relatively damage free. The black patch visible in the center of either piece is some residual graphite which is easily removed by further etching. The resulting single crystal diamond layer has a thickness of about 1.5 $\mu$m and is slightly curled towards the unimplanted side due to some internal stress.

Example 2

Figure 3:
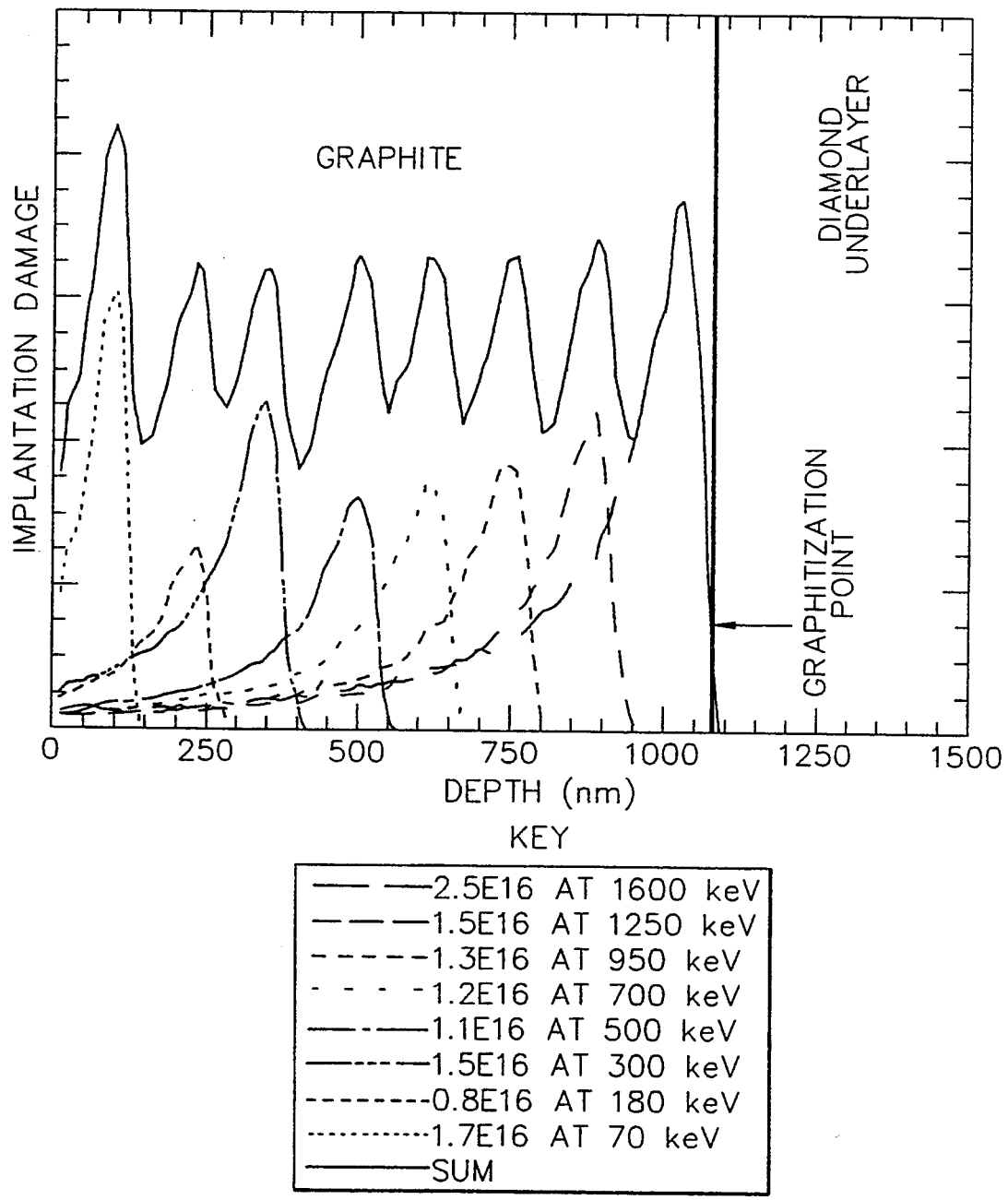
FIG. 3 is a graph showing simulated implantation damage versus depth during multiple ion implant steps of a single crystal diamond substrate with $C^+$ ions corresponding to Example 2.

A Type IIa single crystal diamond substrate available from Dubbeldee Harris Diamond Corporation is implanted with $C^+$ ions to produce significant damage. The amount of damage is calculated to be above a previously determined threshold (approx. 10% atomic displacement) at which, upon annealing, the damaged layer will convert to the graphitic layer. Implantation energies and does are chosen to produce a damaged layer extending from the surface to a depth of about one micron (See Table 1 and FIG. 3). The implantation is performed through a 8000 Å gold mask in order to produce a pattern of damaged and undamaged diamond. After implantation, the diamond is annealed in vacuum at 950° C.

TABLE 1

| Implant Energy | Implant Dose | Ion Range |
|---|---|---|
| $2.5 \cdot 10^{16} C^+/cm^2$ | 1600 kev | 10300 ± 530 Å |
| $1.5 \cdot 10^{16} C^+/cm^2$ | 1250 kev | 8800 ± 500 Å |
| $1.3 \cdot 10^{16} C^+/cm^2$ | 950 kev | 7480 ± 480 Å |
| $1.2 \cdot 10^{16} C^+/cm^2$ | 700 kev | 6180 ± 450 Å |
| $1.1 \cdot 10^{16} C^+/cm^2$ | 500 kev | 4960 ± 420 Å |
| $1.5 \cdot 10^{16} C^+/cm^2$ | 300 kev | 3440 ± 365 Å |
| $0.8 \cdot 10^{16} C^+/cm^2$ | 180 kev | 2295 ± 305 Å |
| $1.7 \cdot 10^{16} C^+/cm^2$ | 70 kev | 1010 ± 200 Å |

The diamond substrate is placed in hot chromic acid for 90 minutes without any significant etching taking place. After the acid bath, the implanted area is still approximately 700 Å above the surface of the unimplanted substrate. This may reflect en etch of only a few hundred angstroms.

The diamond substrate is then placed in a muffle furnace and heated in molecular oxygen to 550° C. Below 500° C., no etching effect on graphite or damaged diamond is observed. After 15 min at 550° C., significant etching of the graphitic layer is apparent. A further 20 min etch at 600° C. results in complete removal of the black graphitic material with no apparent effect on the unimplanted diamond. An upper temperature threshold of 650° C. was reached at which point the unimplanted diamond began to be etched.

Figure 4:
FIG. 4 is an SEM micrograph of a selectively etched single crystal diamond substrate corresponding to Example 2.

FIG. 4 shows an SEM micrograph of the substrate showing the smoothness of the bottom of the etched region. The lateral straggling of the multiple implants can be seen as ridges in the side wall. Alpha step measurements of the etched mesas show an etch depth of about 1.2 $\mu$m. From these measurements the etch rate is at least 2 $\mu$m/hr, ten times that for chromic acid etching.

Example 3

Figure 5:
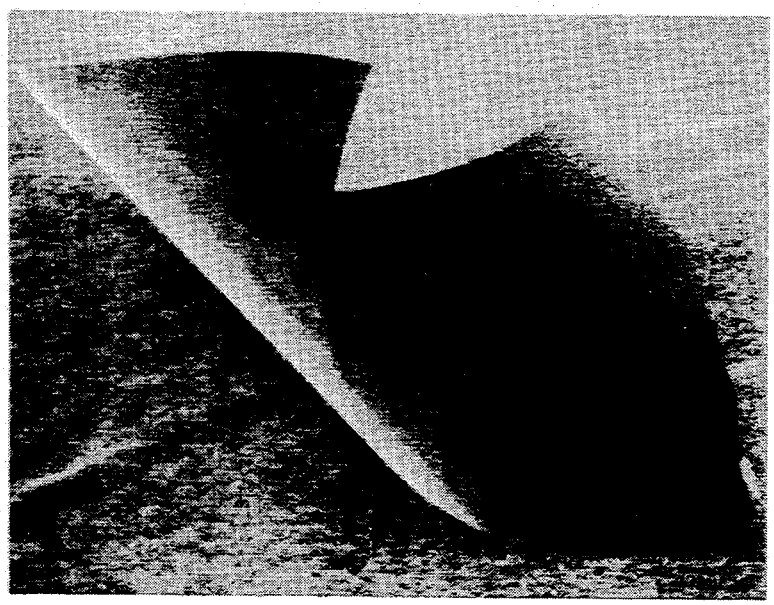
FIG. 5 is an SEM micrograph of a selectively etched single crystal diamond substrate corresponding to Example 3.

A Type 1A single crystal diamond substrate measuring 4×4×0.25 mm is cooled to 80 K. and implanted with $10^{18}$ ions $0+/cm^2$ at 5 MeV. The implanted substrate is etched in flowing molecular oxygen at 550° C. for 1 hour. The lifted-off single crystal diamond layer broke into three pieces as it was being removed (subsequent samples have been lifted-off in one piece). One of the pieces (4×1.5 mm) is annealed in a $10^{-5}$ Torr vacuum at 950° C. for 1 hour to remove some residual damage. The SEM photograph is shown in FIG. 5.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed is:

1. A process for selectively etching a diamond substrate comprising the steps of:
   (a) forming one or more graphitic areas within a diamond substrate by implanting the diamond substrate with ions capable of graphitizing diamond to a depth below the surface of the diamond substrate and
   (b) selectively etching the diamond substrate with a gaseous reactant under conditions sufficient to convert the graphitic area to a gaseous product.

2. The process according to claim 1 wherein the conditions sufficient to convert the graphitic area to a gaseous product include substantially avoiding reacting with the diamond of the diamond substrate.

3. The process according to claim 1 wherein the ions are carbon ions.

4. The process according to claim 1 wherein the step of forming one or more graphitic areas of step (a) includes annealing the diamond substrate at a temperature of about 500° C. to 650° C. for about 10 minutes to 1.5 hours.

5. The process according to claim 1 wherein the ions are oxygen ions.

6. The process according to claim 1 wherein the implanting of ions comprises ion implantation at a dose of about $1\times10^{16}$ to $1\times10^{18}$ ions $cm^2$ and an energy of about 1 to 5 MeV.

7. The process according to claim 1 wherein the gaseous reactant is molecular oxygen.

8. A process according to claim 1 wherein the substrate is two or more single crystal diamond substrates placed in contacting relationship with each other with the crystal directions thereof aligned substantially the same.

9. A process according to claim 1 wherein the diamond substrate is formed from diamond selected from the group consisting of natural single crystal diamond, synthetic single crystal diamond, homoepitaxial diamond, heteroepitaxial diamond and polycrystalline diamond.

10. A process according to claim 1 wherein the implanting of the diamond substrate with ions is patterned.

11. A process for selectively etching a single crystal diamond substrate comprising the steps of:
    (a) implanting a single crystal diamond layer with ions to a depth within the single crystal diamond substrate to form one or more graphitic areas below the surface of the diamond layer and
    (b) selectively etching the diamond substrate with molecular oxygen under conditions sufficient to oxidize the graphitic area while substantially avoiding reacting with the diamond of the single crystal diamond substrate.

12. The process according to claim 11 wherein the ions are carbon ions.

13. The process according to claim 12 wherein the step of forming a graphitic area includes annealing the single crystal diamond substrate at a temperature of about 500° C. to 650° C. for about 10 minutes to 1.5 hours.

14. The process according to claim 11 wherein the ions are oxygen ions.

15. The process according to claim 11 wherein the implanting of ions comprises ion implantation at a dose of about $1\times10^{16}$ to $1\times10^{18}$ ions $cm^2$ and an energy of about 1 to 5 MeV.

16. A process according to claim 11 wherein the substrate is two or more single crystal diamond substrates placed in contacting relationship with each other with the crystal directions thereof aligned substantially the same.

17. A process according to claim 11 wherein the single crystal diamond substrate includes a homoepitaxial diamond film deposited thereon.

18. A process for forming a diamond layer having a thickness comprising the steps of:
    (a) forming a graphitic layer within a diamond substrate at a depth below the surface thereof, the graphitic layer dividing the diamond substrate into an upper portion above the graphitic layer and a lower portion beneath the graphitic layer;
    (b) selectively etching the diamond substrate with a gaseous reactant under conditions sufficient to convert the graphitic layer to a gaseous product and to form an interface between the upper and lower portions of the diamond substrate substantially avoiding reacting with the diamond of the upper and lower portions of the diamond substrate; and
    (c) lifting off the upper portion of the diamond substrate from the lower portion of the diamond substrate at the interface to provide a diamond layer having a thickness substantially equal to the depth of the interface.

19. The process according to claim 18 wherein the step of forming a graphitic area includes implanting the diamond substrate with ions capable of graphitizing diamond to a depth within the diamond substrate to form the graphitic layer at the depth.

20. The process according to claim 18 wherein the conditions sufficient to convert the graphitic layer to a gaseous product includes substantially avoiding reacting with the diamond of the upper and lower portions of the diamond substrate.

21. The process according to claim 18 wherein step (b) and step (c) are substantially simultaneous.

22. A process according to claim 19 wherein the implanting of the diamond substrate with ions is patterned.

23. The process according to claim 19 wherein the ions are carbon ions.

24. The process according to claim 23 wherein the step of forming a graphitic area includes annealing the diamond substrate at a temperature of about 500° C. to 650° C. for about 10 minutes to 1.5 hours.

25. The process according to claim 19 wherein the ions are oxygen ions.

26. The process according to claim 19 wherein the implanting of ions comprises ion implantation at a dose of about $1 \times 10^{16}$ to $1 \times 10^{18}$ ions cm$^2$ and an energy of about 1 to 5 MeV.

27. The process according to claim 18 wherein the gaseous reactant is molecular oxygen.

28. A process according to claim 18 wherein the substrate is two or more single diamond substrates placed in contacting relationship with each other with the crystal directions thereof aligned substantially the same.

29. A process according to claim 18 wherein the diamond substrate is formed from diamond selected from the group consisting of natural single crystal diamond, synthetic single crystal diamond, homoepitaxial diamond, heteroepitaxial diamond and polycrystalline diamond.

* * * * *